(12) United States Patent
Ogawa et al.

(10) Patent No.: US 7,973,390 B2
(45) Date of Patent: Jul. 5, 2011

(54) MODIFIER FOR LOW DIELECTRIC CONSTANT FILM, AND METHOD FOR PRODUCTION THEREOF

(75) Inventors: Tsuyoshi Ogawa, Ube (JP); Mitsuya Ohashi, Saitama (JP)

(73) Assignee: Central Glass Company, Limited, Ube-shi (JP)

( * ) Notice: Subject to any disclaimer, the term of this patent is extended or adjusted under 35 U.S.C. 154(b) by 72 days.

(21) Appl. No.: 12/518,003

(22) PCT Filed: Jul. 11, 2007

(86) PCT No.: PCT/JP2007/063777
§ 371 (c)(1),
(2), (4) Date: Jun. 5, 2009

(87) PCT Pub. No.: WO2008/099522
PCT Pub. Date: Aug. 21, 2008

(65) Prior Publication Data
US 2010/0323530 A1    Dec. 23, 2010

(30) Foreign Application Priority Data

Feb. 6, 2007 (JP) .................................. 2007-026783

(51) Int. Cl.
*H01L 21/02* (2006.01)
*C07F 7/10* (2006.01)

(52) U.S. Cl. ............... 257/632; 257/E21.242; 438/787; 438/781; 438/790

(58) Field of Classification Search .......... 257/310–311, 257/374, 389, 410, 411, 506–508, 510, 520, 257/524, 632–651, 671, 701–703, 752, 760, 257/E21.002, E21.242, E21.261, E23.167; 438/38, 211, 216, 221, 225, 240, 257, 261, 438/263, 264, 287, 294–307, 765–794, 967, 438/981

See application file for complete search history.

(56) References Cited

U.S. PATENT DOCUMENTS

| 4,158,717 | A | 6/1979 | Nelson |
| 4,992,306 | A * | 2/1991 | Hochberg et al. ........ 427/255.29 |
| 5,281,455 | A | 1/1994 | Braun et al. |
| 6,331,329 | B1 * | 12/2001 | McCarthy et al. ............ 427/387 |
| 2002/0123242 | A1 * | 9/2002 | Smith et al. ................... 438/787 |
| 2003/0105264 | A1 * | 6/2003 | Bedwell et al. ................. 528/31 |
| 2006/0130966 | A1 | 6/2006 | Babic et al. |
| 2006/0211876 | A1 | 9/2006 | Yoo et al. |

FOREIGN PATENT DOCUMENTS

| JP | 5-200935 A | 8/1993 |
| JP | 6-9937 A | 1/1994 |
| JP | 2000-273176 A | 10/2000 |
| JP | 2002-161138 A | 6/2002 |
| JP | 2006-179913 A | 7/2006 |
| KR | 2005-58893 A | 6/2005 |
| KR | 0636296 B1 | 10/2006 |
| KR | 0722731 B1 | 5/2007 |

OTHER PUBLICATIONS

International Search Report Dated Oct. 9, 2007 (Two (2) Pages).
Chinese Office Action dated Apr. 30, 2010 (Thirteen (13) pages).
Korean Office Action dated Mar. 4, 2011.

* cited by examiner

*Primary Examiner* — Hsien-ming Lee
*Assistant Examiner* — Walter H Swanson
(74) *Attorney, Agent, or Firm* — Crowell & Moring LLP

(57) ABSTRACT

A modifier for lowering relative dielectric constant of a low dielectric constant film used in semiconductor devices, the modifier of the low dielectric constant film being characterized in that it contains as an effective component a silicon compound represented by formula (1)

$$R_{3-n}H_nSiN_3 \qquad (1)$$

in which R is a C1-C4 alkyl group, and n is an integer from 0 to 3.

7 Claims, No Drawings

MODIFIER FOR LOW DIELECTRIC CONSTANT FILM, AND METHOD FOR PRODUCTION THEREOF

TECHNICAL FIELD

The present invention relates, in low dielectric constant films used in semiconductor devices, to a modifier of low dielectric constant films, which is used for lowering relative dielectric constant of low dielectric constant films, and to a method for producing a modified low dielectric constant film.

BACKGROUND OF THE INVENTION

In highly integrated semiconductors in recent years, a low dielectric constant films is used as an interlayer insulation film in order to solve the signal delay problem in a device and to produce a higher speed, power-saving device. There are many kinds of low dielectric constant films, including organic series and inorganic series. Now, the most common one is SiOC film in which carbon has been added to a silica film. As semiconductor devices are further miniaturized in the future, it becomes impossible to obtain sufficient low dielectric constant characteristics even in SiOC film. Therefore, it is expected to use a SiOC film made to be porous, as an interlayer insulation film.

SiOC film, however, has a problem that Si—C bond and Si—H bond in the film are severed after the film formation to generate silanol (Si—OH), resulting in increase of relative dielectric constant of the film. In order to solve such problem, there is publicly known a method in which a silane coupling agent, such as HMDS (hexamethyldisilazane), as a modifier of the film is made to act on SiOC film to chemically silylate silanol and lower relative dielectric constant of the film. Furthermore, in recent years, there has also been reported a method of using TMS-Cl (trimethylchlorosilane), TMSDMA (trimethylsilyldimethylamine), etc, in place of HMDS (Patent Publication 1). In any method, however, relative dielectric constant of the film to be obtained has not yet been satisfied.

Therefore, there has been a demand for a compound capable of modifying low dielectric constant films, such as SiOC film, to chemically silylate silanol and lower it to a satisfactory relative dielectric constant of the film.

Patent Publication 1: Japanese Patent Application Publication 2006-179913

SUMMARY OF THE INVENTION

It is an object of the present invention to provide a modifier capable of modifying low dielectric constant films used in semiconductor devices to chemically silylate silanol of the films and to lower relative dielectric constant of the films.

Furthermore, it is an object to provide a method for producing a low dielectric constant film of which relative dielectric constant has been lowered by the modifier.

As a result of repeating an eager study to achieve the above objects, the present inventors have found out that, when a low dielectric constant film is brought into contact with a modifier containing as an effective component a silicon compound having an azido group in the molecule, silanol in the low dielectric constant film is chemically silylated, thereby making it possible to modify to lower relative dielectric constant of the film. Thus, we have reached the present invention.

That is, the present invention provides a modifier for lower relative dielectric constant of a low dielectric constant film used in semiconductor devices, the modifier of the low dielectric constant film being characterized in that it contains as an effective component a silicon compound represented by formula (1)

$$R_{3-n}H_nSiN_3 \qquad (1)$$

(R is a C1-C4 alkyl group, and n is an integer of 0-3).

Furthermore, it provides a method for producing a modified, low-dielectric-constant film by bringing the modifier containing a silicon compound represented by the above formula (1) into contact with a low dielectric constant film used in semiconductor devices, in a range of 20° C.-300° C.

DETAILED DESCRIPTION

According to the present invention, it is possible to chemically silylate silanol in the low dielectric constant film, lower relative dielectric constant of the low dielectric constant film, and modify the film. Furthermore, according to the method of the present invention, it is possible to produce a modified, low-dielectric-constant film in which relative dielectric constant has been lowered.

In the following, the present invention is described in more detail. The silicon compound as an effective component contained in the modifier of a low dielectric constant film in the present invention is a compound represented by formula (1)

$$R_{3-n}H_nSiN_3 \qquad (1)$$

(R is a C1-C4 alkyl group, and n is an integer of 0-3). The C1-C4 alkyl group in the present invention is specifically methyl group, ethyl group, n-propyl group, i-propyl group, n-butyl group, i-butyl group, s-butyl group, t-butyl group, or the like. In case that R exists in plural number, these may be the same one with each other or a mixture of different ones. In low dielectric constant films in recent years, however, the trend to make them porous has been proceeding. In order to make the modifier penetrate into the void spaces in the film too, it is preferable that these compounds are smaller in molecular size. As R, particularly methyl group is preferable.

There is described in detail the mechanism of lowering of relative dielectric constant of a low dielectric constant film in the present invention. When silanol is generated in a low dielectric constant film, relative dielectric constant of the film increases. Herein, the compound represented by formula (1) contained in the modifier conducts a silylation reaction to active hydrogen moiety of the silanol, as in the reaction formula shown in formula (2).

Si—OH+$R_{3-x}H_xSi'N_3$→Si—O—Si'$H_xR_{3-x}$+$HN_3$ (2) (Si' is an expression for distinguishing it from Si forming the film and corresponds to Si of formula (1).) As a result, silanol in the film decreases, and relative dielectric constant of the film lowers. After the reaction, since hydrogen azide ($HN_3$) is generated, this is discharged to the outside of the system. Hydrogen azide is hazardous, and it is discarded after conducting a proper treatment to make it harmless.

The effective component of the modifier, which is represented by formula (1), may be used as a single component or in a condition that a plurality of components having different substituents are combined. For example, it is possible to mix azidotrimethylsilane (($CH_3)_3SiN_3$) with azidotriethylsilane (($CH_3CH_2)_3SiN_3$) at an arbitrary ratio and use them. Furthermore, the modifiers having these as effective components may be used in a condition that they have been mixed with an existing silane coupling agent at an arbitrary ratio. As the existing silane coupling agent, it is possible to cite HMDS (hexamethyldisilazane), TMDS (tetramethyldisilazane), TMSDMA (trimethylsilyldimethylamine), DMSDMA (dimethylsilyldimethylamine), TMSDEA (trimethylsilyldiethylamine), B[DMA]MS (bisdimethylaminomethylsilane), B[DMA]DS (bisdimethylaminodimethylsilane), TMS-Cl (trimethylchlorosilane), TMMOS (trimethylmethoxysilane), etc. Furthermore, it can be used by dilution with inert gas such as helium. Anyway, it is necessary to contain at least certain concentration of the compound represented by formula (1) in the modifier. Its concentration is 1 vol %-100 vol %, preferably 50 vol %-100 vol %, more preferably 95 vol %-100 vol %.

The temperature upon bringing the modifier into contact with a low dielectric constant film is preferably in a range of 20° C.-300° C.; particularly 60° C.-200° C. is preferable. If the temperature becomes less than 20° C., the rate of the reaction between the effective component in the modifier and the silanol becomes extremely low. Furthermore, azidation reaction of the silanol also proceeds as a side reaction. Therefore, it is not preferable. On the other hand, if the temperature exceeds 300° C., decomposition of the effective component in the modifier occurs preferentially. Therefore, it is not preferable.

When the modifier is brought into contact with a low dielectric constant film, it is possible to use the modifier in either gaseous condition or liquid condition. In the case of using it in gas, it may be directly brought into contact with the low dielectric constant film. In the case of using it in liquid, a method for spin coating the low dielectric constant film is preferable. In any method, it must be conducted without exposure to the air.

The time upon bringing the modifier into contact with a low dielectric constant film is not particularly limited. However, a contact of 10-120 seconds is preferable in order to shorten the time for producing semiconductor devices, too.

After the contact of the modifier with a low dielectric constant film, it is possible to remove the unreacted modifier and the reaction product by depressurizing the inside of the apparatus. Upon this, it may be conducted, while increasing the temperature of the inside of the apparatus to improve the removal efficiency.

A low dielectric constant film in the present invention contains one in which pores exist in the film, too. However, the method for forming these films is not particularly limited. As a method for forming the film, it is possible to cite, for example, plasma CVD method and spin-on-glass method.

In the following, the present invention is specifically explained by examples.

EXAMPLE 1

A MSQ (methylsilsesquioxane) solution was applied on a silicon wafer by spin coating, followed by baking at 100° C. for 30 minutes and at 200° C. for 1 hr, thereby forming a MSQ film. To determine relative dielectric constant of the obtained MSQ film, an Al electrode was formed on the film by vapor deposition method, and electrostatic capacity of the film at 1 MHz was measured. Relative dielectric constant of the MSQ film was calculated from the electrostatic capacity value, the film thickness and the electrode area. With this, it was 3.6. Then, a sealable container made of stainless steel was prepared, and the MSQ film was transferred into the container. The inside of the container was depressurized to 10 Pa, the temperature was increased to 150° C., and then vapor of azidotrimethylsilane $((CH_3)_3SiN_3)$ was introduced as the modifier by 10 kPa. The silylation treatment was conducted for 60 seconds. Relative dielectric constant of the MSQ film after the modification was measured. With this, it was 3.2.

EXAMPLE 2

The same method as that of Example 1 was conducted except in that azidotriethylsilane $((CH_3CH_2)_3SiN_3)$ was used as the modifier of the MSQ film. Relative dielectric constant of the MSQ film after the modification was 3.3.

EXAMPLE 3

The same method as that of Example 1 was conducted except in that azidodimethylsilane $((CH_3)_2HSiN_3)$ was used as the modifier of the MSQ film. Relative dielectric constant of the MSQ film after the modification was 3.2.

EXAMPLE 4

The same method as that of Example 1 was conducted, except in that the temperature upon introducing the modifier was adjusted to 70° C. Relative dielectric constant of the MSQ film after the modification was 3.3.

EXAMPLE 5

The same method as that of Example 1 was conducted except in that a mixture (a mixing ratio of 1:1) of azidotrimethylsilane $((CH_3)_3SiN_3)$ and HMDS (hexamethyldisilazane) was used as the modifier of the MSQ film. Relative dielectric constant of the MSQ film after the modification was 3.3.

Comparative Example 1

The same method as that of Example 1 was conducted except in that HMDS (hexamethyldisilazane) was used as the modifier of the MSQ film. Relative dielectric constant of the MSQ film after the modification was 3.4.

Comparative Example 2

The same method as that of Example 1 was conducted except in that the temperature upon introducing the modifier was adjusted to 450° C. Relative dielectric constant of the MSQ film after the modification was 3.8, and no lowering of relative dielectric constant was found.

The invention claimed is:

1. A modifier for lowering relative dielectric constant of a low dielectric constant film used in semiconductor devices, the modifier of the low dielectric constant film comprising as an effective component a silicon compound represented by formula (1)

$$R_{3-n}H_nSiN_3 \qquad (1)$$

(R is a C1-C4 alkyl group, and n is an integer of 0-3).

2. The modifier of the low dielectric constant film according to claim 1, wherein R of formula (1) is a methyl group.

3. The modifier of the low dielectric constant film according to claim 1, wherein the silicon compound is azidotrimethylsilane $((CH_3)_3SiN_3)$, azidotriethylsilane $((CH_3CH_2)_3SiN_3)$, or azidodimethylsilane $((CH_3)_2HSiN_3)$.

4. The modifier of the low dielectric constant film according to claim 1, further comprising a silane coupling agent.

5. A method for producing a modified, low-dielectric-constant film, comprising bringing a modifier containing a silicon compound represented by formula (1) according to claim 1, into contact with a low dielectric constant film used in semiconductor devices, in a temperature range of 20° C.-300° C.

6. The method for producing the modified, low-dielectric-constant film according to claim 5, wherein the temperature range is of 60° C.-200° C.

7. The method for producing the modified, low-dielectric-constant film according to claim 5, wherein the bringing is conducted with no exposure to the air.

* * * * *